(12) United States Patent
Zhang et al.

(10) Patent No.: US 11,614,090 B2
(45) Date of Patent: Mar. 28, 2023

(54) HIGH-LIFT SHIELDED PERMANENT MAGNET MULTISTAGE PUMP AND CONTROL METHOD

(71) Applicant: Zhejiang Zheshui Industry and Trade Co., Ltd., Wenling (CN)

(72) Inventors: Wenmin Zhang, Wenling (CN); Fen Zhang, Wenling (CN)

(73) Assignee: Zhejiang Zheshui Industry and Trade Co., Ltd., Wenling (CN)

( * ) Notice: Subject to any disclaimer, the term of this patent is extended or adjusted under 35 U.S.C. 154(b) by 333 days.

(21) Appl. No.: 16/916,394

(22) Filed: Jun. 30, 2020

(65) Prior Publication Data

US 2021/0332821 A1   Oct. 28, 2021

(30) Foreign Application Priority Data

Apr. 24, 2020   (CN) .......................... 202010332014.9

(51) Int. Cl.
| | |
|---|---|
| *F04D 13/06* | (2006.01) |
| *H02K 7/14* | (2006.01) |
| *H02K 7/00* | (2006.01) |

(Continued)

(52) U.S. Cl.
CPC ............. *F04D 13/08* (2013.01); *F04D 3/00* (2013.01); *F04D 15/0077* (2013.01); *F04D 29/026* (2013.01); *F04D 29/043* (2013.01); *F04D 29/106* (2013.01); *F04D 29/708* (2013.01); *H02K 7/003* (2013.01); *H02K 7/14* (2013.01);

(Continued)

(58) Field of Classification Search
CPC ........ F04D 13/08; F04D 3/00; F04D 15/0077; F04D 29/026; F04D 29/043; F04D 29/106; F04D 29/708; F04D 13/0693; F04D 29/0413; F04D 13/10; F04D 1/066; F04D 15/0066; F04D 15/0281; F04D 29/041; F04D 29/426; F04D 29/5806; H02K 7/003; H02K 7/14; H02P 29/027; G01P 3/00; G01R 15/202; G01R 19/0092
See application file for complete search history.

(56) References Cited

U.S. PATENT DOCUMENTS 2,814,254 A  *  11/1957  Litzenberg ................ F04D 1/06
                                                        415/199.1
3,274,942 A  *   9/1966  Lung ....................... F04D 13/10
                                                        415/131

(Continued)

*Primary Examiner* — Dominick L Plakkoottam
(74) *Attorney, Agent, or Firm* — Bayramoglu Law Office LLC

(57) ABSTRACT

A high-lift shielded permanent magnet multistage water pump includes a pump shell, a motor assembly and an impeller. The motor assembly includes a motor barrel, a stator, a rotor and a rotor shaft. The pump shell is sleeved on an outside of motor barrel. An upper and a lower connection base for fixing the motor barrel is provided in the pump shell. A waterway cavity is formed between the pump shell and motor barrel. An upper and a lower impeller cavities are respectively formed at an upper and a lower ends of the pump shell. The lower impeller cavity, water passing cavity and upper impeller cavity are in sequential fluid communication. Both ends of the rotor shaft with an axel provided on pass through the upper and the lower connection bases respectively. The impeller is a multistage structure and mounted on the axle at both ends respectively.

15 Claims, 5 Drawing Sheets

(51) Int. Cl.
   *H02P 29/024*   (2016.01)
   *F04D 13/08*    (2006.01)
   *F04D 15/00*    (2006.01)
   *F04D 29/02*    (2006.01)
   *F04D 29/043*   (2006.01)
   *F04D 29/10*    (2006.01)
   *F04D 29/70*    (2006.01)
   *F04D 3/00*     (2006.01)
   *G01P 3/00*     (2006.01)
   *G01R 15/20*    (2006.01)
   *G01R 19/00*    (2006.01)

(52) U.S. Cl.
   CPC ........ *H02P 29/027* (2013.01); *F04D 13/0693* (2013.01); *G01P 3/00* (2013.01); *G01R 15/202* (2013.01); *G01R 19/0092* (2013.01)

(56) References Cited

U.S. PATENT DOCUMENTS

| | | | | |
|---|---|---|---|---|
| 3,437,046 A   * | 4/1969  | Lotspih   | ................... | F04D 13/10 |
| | | | | 415/214.1 |
| 4,229,142 A   * | 10/1980 | Le Dall   | ................. | F04D 29/628 |
| | | | | 417/350 |
| 5,478,215 A   * | 12/1995 | Kobayashi | ............ | F04D 29/628 |
| | | | | 415/213.1 |
| 5,704,761 A   * | 1/1998  | Kobayashi | .............. | F04D 1/006 |
| | | | | 415/102 |
| 2002/0192089 A1* | 12/2002 | Hill    | ....................... | F04D 29/584 |
| | | | | 417/350 |
| 2015/0143822 A1* | 5/2015  | Chalmers  | ............ | F04D 29/5806 |
| | | | | 417/424.2 |

* cited by examiner

HIGH-LIFT SHIELDED PERMANENT MAGNET MULTISTAGE PUMP AND CONTROL METHOD

CROSS REFERENCE TO THE RELATED APPLICATIONS

This application is based upon and claims priority to Chinese Patent Application No. 202010332014. 9, filed on Apr. 24, 2020, the entire contents of which are incorporated herein by reference.

TECHNICAL FIELD

The present invention relates to water pumps, and more particularly, to a high-lift shielded permanent magnet multistage pump and control method.

BACKGROUND

A submersible pump is suitable for extracting groundwater from a deep well. Such a pump can also be used for water lifting projects where it is desirous to change the natural course of a water body such as a river, reservoir or canal. In order to obtain a higher lift, a multistage impeller and a diversion component are generally disposed on a pump shaft. The multistage impellers of existing submersible pumps, however, are typically mounted on the pump shaft in one direction. As the number of impellers increases, the rotation stability of the pump shaft gradually increases and operation of the pump becomes unstable.

The number of impellers able to be used, therefore, becomes limited, which in turn, necessarily limits the height to which the pump can elevate water. Moreover, the manner in which existing submersible pumps are cooled is especially under-developed. Current pumps are submerged in water to achieve water cooling, but the cooling effect is not optimal and the submersible pump cannot be used remotely from the water source. Another shortcoming of existing pumps deals with water purity. If the water contains more sediment, the load on the submersible pump's motor increases, the energy consumption is increased and the pump's mechanical parts become jammed and seize-up, which causes damage to the pump.

SUMMARY

The purpose of the present invention is to provide a high-lift shielded permanent magnet multistage pump that easily dissipates heat from the motor and has improved overall efficiency and energy savings when compared to prior pumps. Another object of the invention is to provide a pump with optimal power savings.

The purpose of the present invention is achieved by a high-lift shielded permanent magnet multistage pump that includes a pump shell, a motor assembly and an impeller. The motor assembly includes a motor barrel, a stator, a rotor and a rotor shaft. The pump shell is sleeved on an outside of the motor barrel. An upper connection base and a lower connection base for fixing the motor barrel is provided in the pump shell. A waterway cavity is formed between the pump shell and the motor barrel. An upper impeller cavity is formed at an upper end of the pump shell, and a lower impeller cavity is formed at a lower end of the pump shell. The lower impeller cavity, the water passing cavity and the upper impeller cavity are in sequential fluid communication. Both ends of the rotor shaft pass through the upper connection base and the lower connection base, respectively. An axle is provided on the both ends of the rotor shaft. The impeller is a multistage structure and mounted on the axle at both ends of the rotor shaft, respectively.

In another aspect of the invention, the upper connection base includes an upper end cover, and the lower connection base includes a lower end cover. Both of the upper end cover and the lower end cover include an axle hole through which the axle passes. A graphite sleeve is provided in the axle hole, and a ceramic coating matching the graphite sleeve is provided on the rotor shaft.

In another aspect, the rotor shaft is also sleeved with a thrust structure provided between the lower end cover and the rotor. The thrust structure includes an upper friction plate, a lower friction plate and a thrust base arranged successively from top to bottom. A spherical groove is provided on an upper surface of the axle hole of the lower end cover, and a spherical bump adapted to the spherical groove is provided at a bottom of the thrust base.

In still another aspect of the invention, a first limiting groove is provided on a top surface of the thrust base. A first limiting bump, or stop, adapted to the first limiting groove is provided on a bottom surface of the lower friction plate. A second limiting groove is provided in the spherical groove, and a second limiting bump, or stop, adapted to the second limiting groove is provided on an outer wall of the spherical bump.

In another aspect, the rotor shaft is also sleeved with a sand throwing mechanism provided between a lower end of the lower connection base and an upper end of the upper connection base. The sand throwing mechanism includes a sand throwing base and a sand throwing ring correspondingly adapted to the base. A skeleton oil seal is provided both between the sand throwing base and the lower end cover and between the sand throwing base and the upper end cover.

In yet another aspect of the invention, a waterway opening penetrating the motor barrel is provided on both the upper connection base and the lower connection base. A filter screen is provided on the waterway opening, and the motor assembly adopts a shielded permanent magnet motor.

In still another aspect, a bottom of the motor barrel is a water inlet end. A top of the motor barrel is a water outlet end, and a bottom connection base is provided on the water inlet end. A lower axle sleeve, through which the axle passes, is provided on the bottom connection base, and a threaded connection port is provided on the bottom connection base.

In another aspect, a pressing chamber is provided at a top of the pump shell. An upper axle sleeve, through which the axle passes, is provided in the pressing chamber. The axle is also sleeved with an upper friction ring provided between the upper axle sleeve and the impeller and a lower friction ring provided between the lower sleeve and the impeller.

By adopting the above technical solution, in use, the water flow directly passes through the motor shell, the heat dissipation of the motor is fast, it is not easy to generate heat, the overall efficiency can be improved, and more energy saving and power saving is achieved.

Impellers are mounted on both ends of the rotor shaft at the same time. When rotating, the stability is optimal, the load is small, the number of impellers that can be mounted is increased. The lift is improved, and the overall efficiency is higher than that of prior pumps.

A bottom of the shell is connected to the bottom connection base. When a filter shell is mounted on a threaded connection port of the bottom connection base, the multistage pump can be used as a submersible pump underwater.

When a flange plate is mounted on the threaded connection port, it can be mounted on the pipeline as a pipeline booster pump. When a one-way valve and a water pipe are connected to the threaded connection port, the novel pump can be used on land as a self-priming pump, so as to achieve multi-function purpose.

In addition, when connected to the pipeline, a pressure sensor is disposed on a water outlet end of the multistage pump to detect the water outlet pressure. The pressure sensor feeds the detection signal back to a drive control system of the permanent magnet motor. The drive control system adjusts the speed of the permanent magnet motor according to the change of pressure to achieve constant pressure water supply.

The motor coil is sealed with epoxy resin, which waterproofs the motor and has explosion-proof properties.

In another aspect of the invention, a control method for the high-lift shielded permanent magnet multistage pump includes: provisioning a PLC control unit for controlling an operation state of the multistage pump, a current sensor for detecting a current change during operation of the multistage pump, and an alarm module connected to the PLC control unit. The PLC control unit presets a two-level overcurrent protection current value. The two-level overcurrent protection current value includes a low-level overcurrent protection $I_1$ and a high-level overcurrent protection $I_2$, and $I_1 < I_2$. The PLC control unit also includes a counting module and a speed regulation module. The counting module includes a low-level overcurrent protection counter, a high-level overcurrent protection counter, a current normal counter, a half-speed forward counter and a half-speed reverse counter.

The control method includes the following steps:

an activation phase: the PLC control unit controls the motor to activate slowly by the speed regulation module;

the normal operation phase:

L1. the motor operates, the PLC control unit collects a motor current I in real-time every P seconds by the current sensor;

L2. the PLC control unit compares the collected motor current I with the low-level overcurrent protection $I_1$ and the high-level overcurrent protection $I_2$ respectively, if $I > I_2$, each of the low-level overcurrent protection counter and the high-level overcurrent protection counter is increased by 1, and the motor normal counter is cleared; if $I_1 < I < I_2$, the low-level overcurrent protection counter is increased by 1, and the motor normal counter is cleared; if $I < I_1$, the motor operates normally at full speed, and the motor normal counter is increased by 1, and if the motor normal counter reaches M times, the low-level overcurrent protection counter, the high-level overcurrent protection counter and the half-speed reverse counter are all cleared;

L3. if the motor current exceeds the low-level overcurrent protection $I_1$ or the high-level overcurrent protection $I_2$ in step L2, it is judged whether the low-level overcurrent protection is exceeded for X times or whether the high-level overcurrent protection is exceeded for Y times;

L4. if it is judged in step L3 that the low-level overcurrent protection reaches X times but the high-level overcurrent protection does not reach Y times, the motor is decelerated to half-speed and forwards for A seconds, the half-speed forward counter is increased by 1, and then it is judged whether the half-speed forward counter reaches F times;

L5. if it is judged in step L3 that the high-level overcurrent protection reaches Y times, go to step L9;

L6. if NO in step L3, return to step L1;

L7. if YES in step L4, go to step L9;

L8. if NO in step L4, the motor resumes forward at full speed and returns to step 1;

L9. the motor pauses for B seconds, and then the motor reverses at half speed for C seconds, the half-speed reverse counter is increased by 1, and it is judged whether the number of half-speed reverses reaches N times;

L10. if YES in step L9, the motor is powered off and an alarm is issued by the alarm module;

L11. if NO in step L9, the motor rotates forward at full speed and returns to step L1.

In another aspect of the invention, a rotation speed sensor for detecting a rotation speed change during operation of the multistage pump and a Hall sensor for detecting each phase current of the motor are also included. The counting module includes a restart number counter.

The activation phase includes the following steps:

Q1. when the motor is powered on, the PLC control unit controls the motor to activate slowly through the speed regulation module;

Q2. the rotation speed sensor collects a rotation speed signal of the motor, judges a rotation speed state of the motor, and judges whether the restart number of the motor reaches E times;

Q3. if the restart number of the motor is less than E times in step Q2, and the rotation speed of the motor is lower than a normal rotation speed or the motor fails to rotate, the PLC control unit collects a current signal by the Hall sensor, judges whether a phase current difference is greater than 10%, and detects whether the motor current I is greater than the high-level overcurrent protection $I_2$;

Q4. if the phase current difference is less than 10% and $I < I_2$ in step Q3, the PLC control unit increases a torque signal and returns to step Q2;

Q5. if the phase current difference is greater than 10% and $I < I_2$ in step Q3, it is judged whether duration time is greater than a set time;

Q6. if YES in step Q5, go to step Q7;

Q7. the motor stops operation, after a delay of a first preset time, the motor reverses, and the restart number counter is increased by 1; after a delay of a second preset time, the motor stops reversing; after a delay of a third preset time, return to step Q1;

Q8. if NO in step Q5, return to step Q2;

Q9. if $I \geq I_2$ in step Q3, return to step Q7;

Q10. if the restart number of the motor reaches E times in step Q2, the motor is powered off and an alarm is given by the alarm module;

Q11. if the rotation speed is normal in step Q2, the motor activates normally and the restart number counter is cleared.

By adopting the above control method, the multistage pump is effectively prevented from being clogged. When the sediment impurities in water affect the multistage pump, the load current I of the motor will increase. When the load current I exceeds a certain limit, the PLC control unit controls the rotation speed of the motor to drop, so that the sediment can be discharged slowly to avoid further accumulation. When the speed reduction cannot solve the clogging problem, the PLC control unit controls the motor to reverse, so that the sediment impurities can be washed out in a reverse direction, and the operation of the multistage pump returned to normal. When neither speed reduction nor reverse rotation can solve the clogging problem, the PLC control unit controls the motor to stop and issues an alarm signal by the alarm module to protect the motor. At the same time, detection and control are performed on the activation phase, which can avoid damage to the motor when the motor cannot activate normally or the motor is damaged due to clogging when activating.

Figure 1:
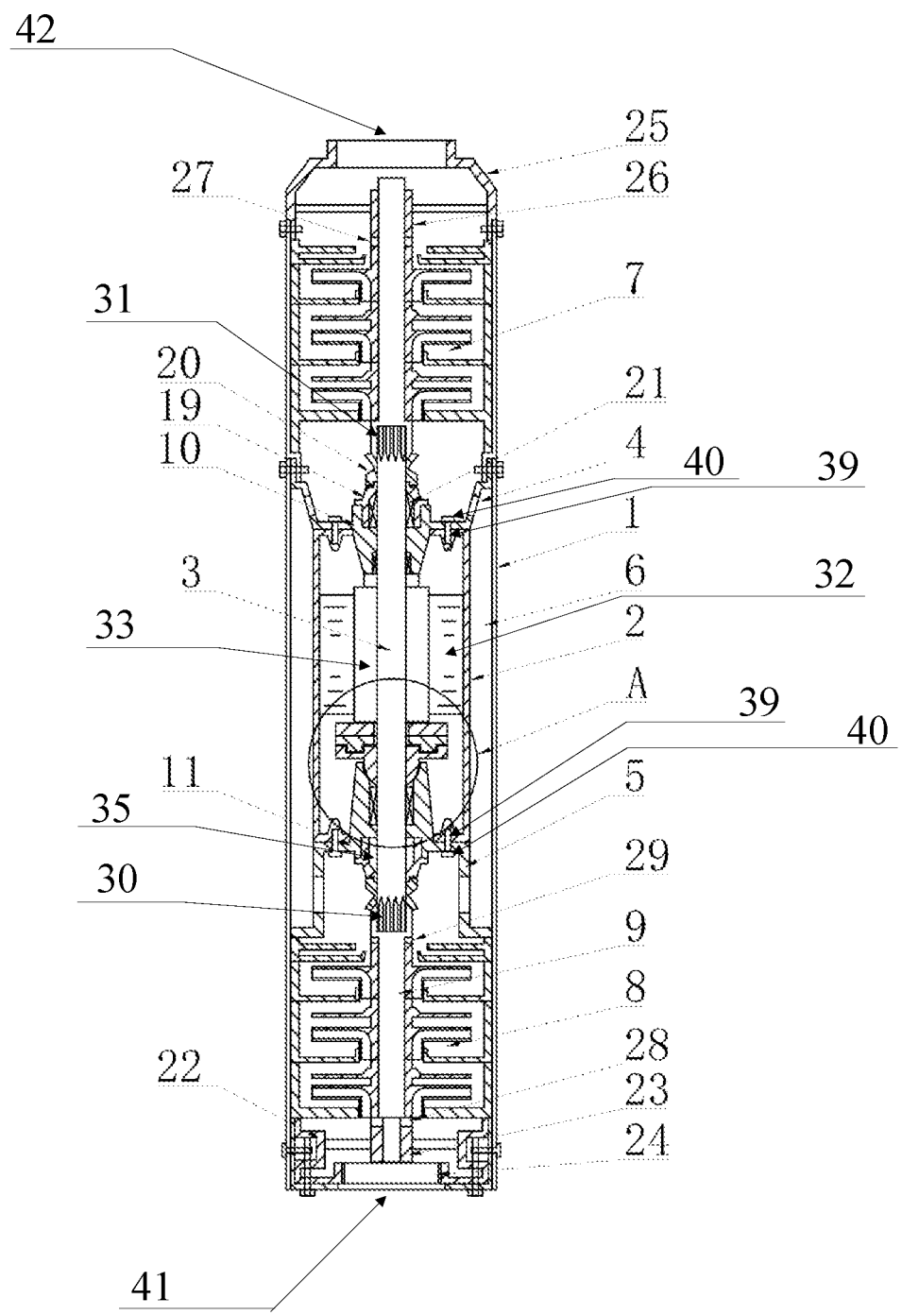
FIG. 1 is a schematic sectional view of the present invention.
Figure 2:
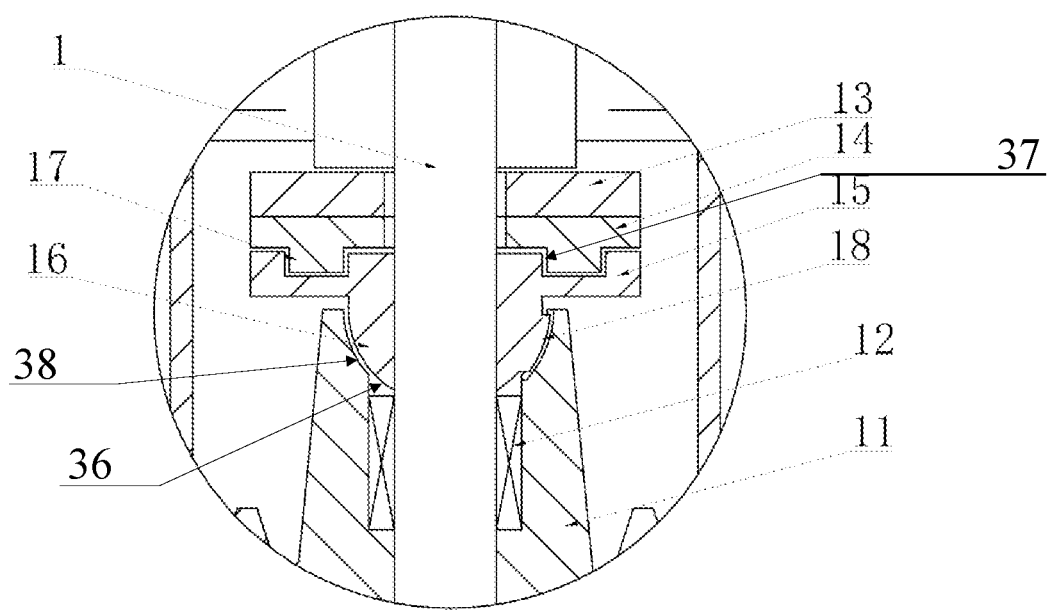
FIG. 2 is an enlarged schematic structural view of part A in FIG. 1 of the present invention.
Figure 3:
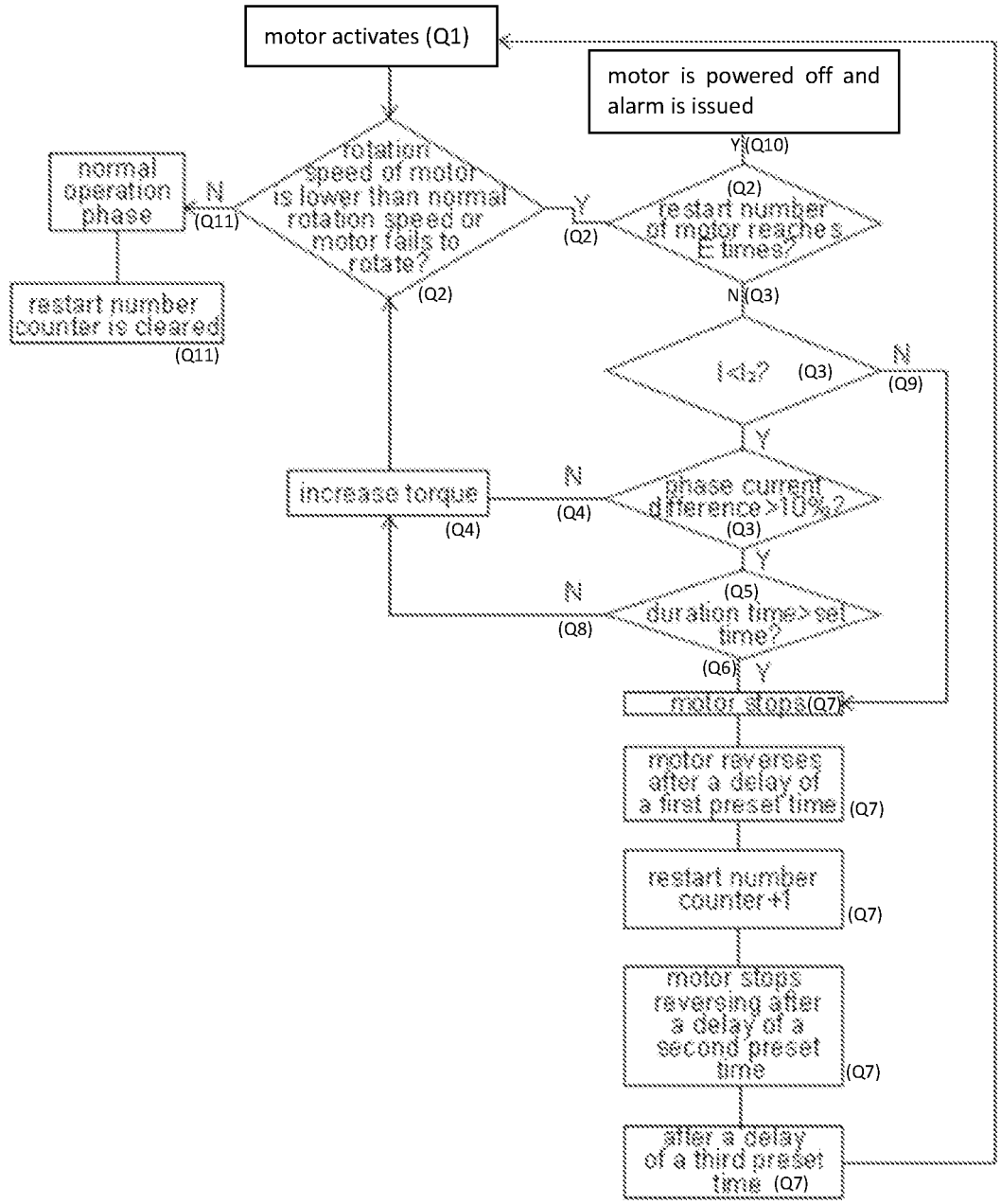
FIG. 3 is a logic block diagram of the activation phase in Embodiment 2 of the present invention.
Figure 4:
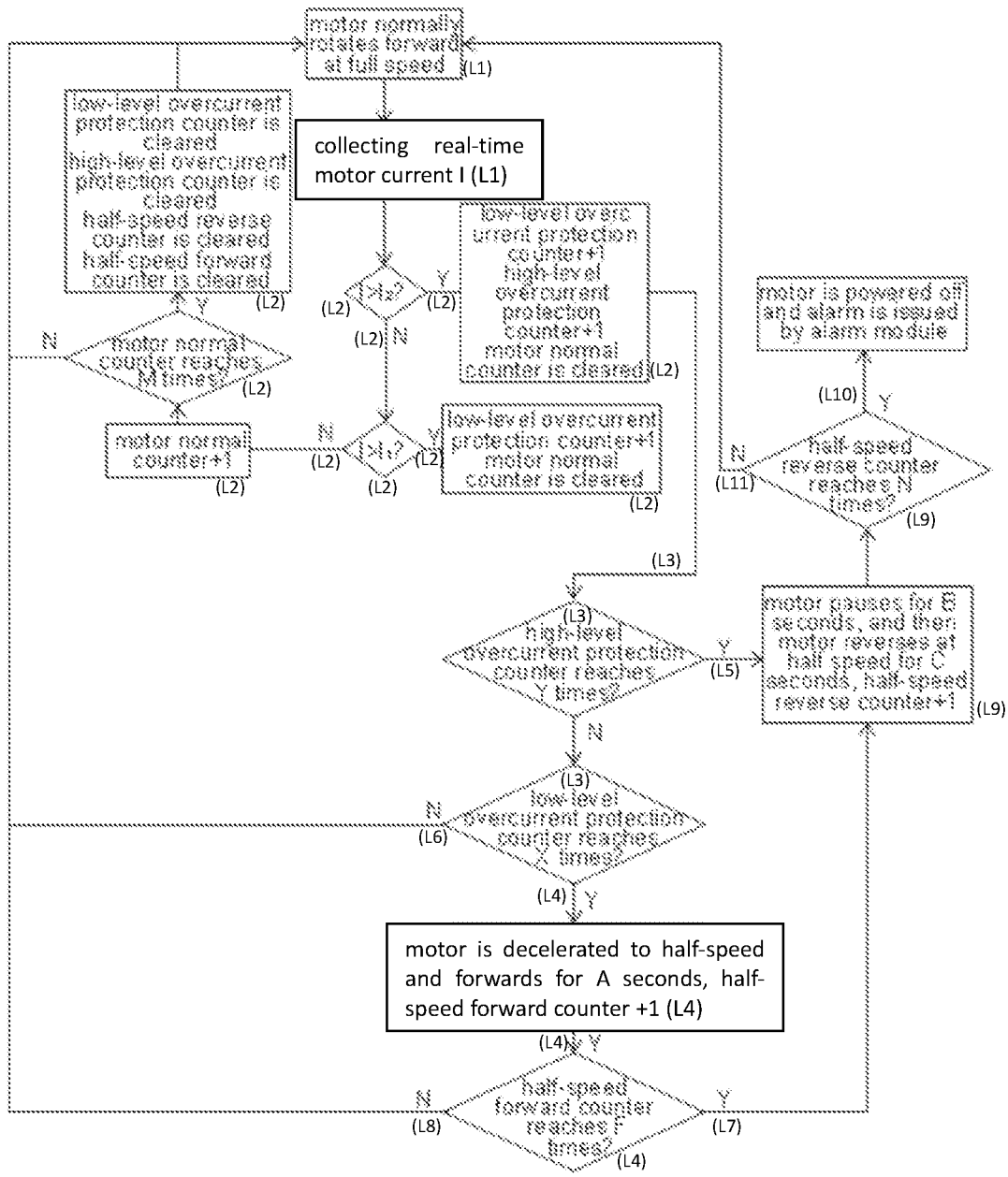
FIG. 4 is a logic block diagram of the normal operation stage in Embodiment 2 of the present invention.

The reference signs in the drawings: 1. Pump shell; 2. Motor barrel; 3. Rotor shaft; 4. Upper connection base; 5. Lower connection base; 6. Waterway cavity; 7. Upper impeller cavity; 8. Lower impeller cavity; 9. Axle; 10. Upper end cover; 11. Lower end cover; 12. Graphite sleeve; 13. Upper friction plate; 14. Lower friction plate; 15. Thrust base; 16. Spherical bump; 17. First limiting bump; 18. Second limiting bump; 19. Sand throwing base; 20. Sand throwing ring; 21. Skeleton oil seal; 22. Bottom connection base; 23. Lower axle sleeve; 24. Threaded connection port; 25. Pressing chamber; 26. Upper axle sleeve; 27. Upper friction ring; 28. Lower friction ring; 29. Axial friction ring.

DETAILED DESCRIPTION OF THE EMBODIMENTS

The present invention will be further described below with reference to the drawings (referring to FIGS. 1-4) by specific embodiments.

Embodiment 1

A high-lift shielded permanent magnet multistage pump, including a pump shell 1, a motor assembly and impellers 30 and 31, the motor assembly including a motor barrel 2, a stator 32, a rotor 33, and a rotor shaft 3. The pump shell 1 is sleeved on an outside of the motor barrel 2, an upper connection base 4 and a lower connection base 5 for fixing the motor barrel 2 is provided in the pump shell 1. A waterway cavity 6 is formed between the pump shell 1 and the motor barrel 2. An upper impeller cavity 7 is formed at an upper end of the pump shell 1, and a lower impeller cavity 8 is formed at a lower end of the pump shell 1. The lower impeller cavity 8, the waterway cavity 6 and the upper impeller cavity 7 communicate in sequence. Both ends of the rotor shaft 3 pass through the upper connection base 4 and the lower connection base 5 respectively. An axle 9 is provided on the both ends of the rotor shaft 3, and the impellers 30 and 31 are multistage structures and mounted on the axle 9 at the both ends of the rotor shaft 3, respectively.

When in use, water is vacuumed from a water inlet at a bottom of the pump shell 1, then enters the waterway cavity 6 after passing through the lower multistage impeller 30. Then water is pressurized through the upper multistage impeller 31 and discharged through the water outlet on the pressing chamber 25. In the above manner, the water flow can quickly cool and dissipate the heat of the outer wall of the motor assembly. Moreover, the impellers 30 and 31 are disposed up and down in both directions, the rotor shaft 3 has better rotation stability and can withstand greater load.

The number of impellers can be increased, so that the lift of the water pump is greatly improved.

In the actual test, the water pump was submerged 1000 meters underwater. In use, the rotation speed of the permanent magnet high-speed motor reached 6000 rpm, and when a single-stage impeller is mounted at both ends of the rotor shaft 3, the lift reached 25 meters. When 40 impellers are mounted at both ends of the rotor shaft 3 respectively, the lift can reach 2000 meters, and the overall height of the water pump is less than 3 meters.

Figure 5:
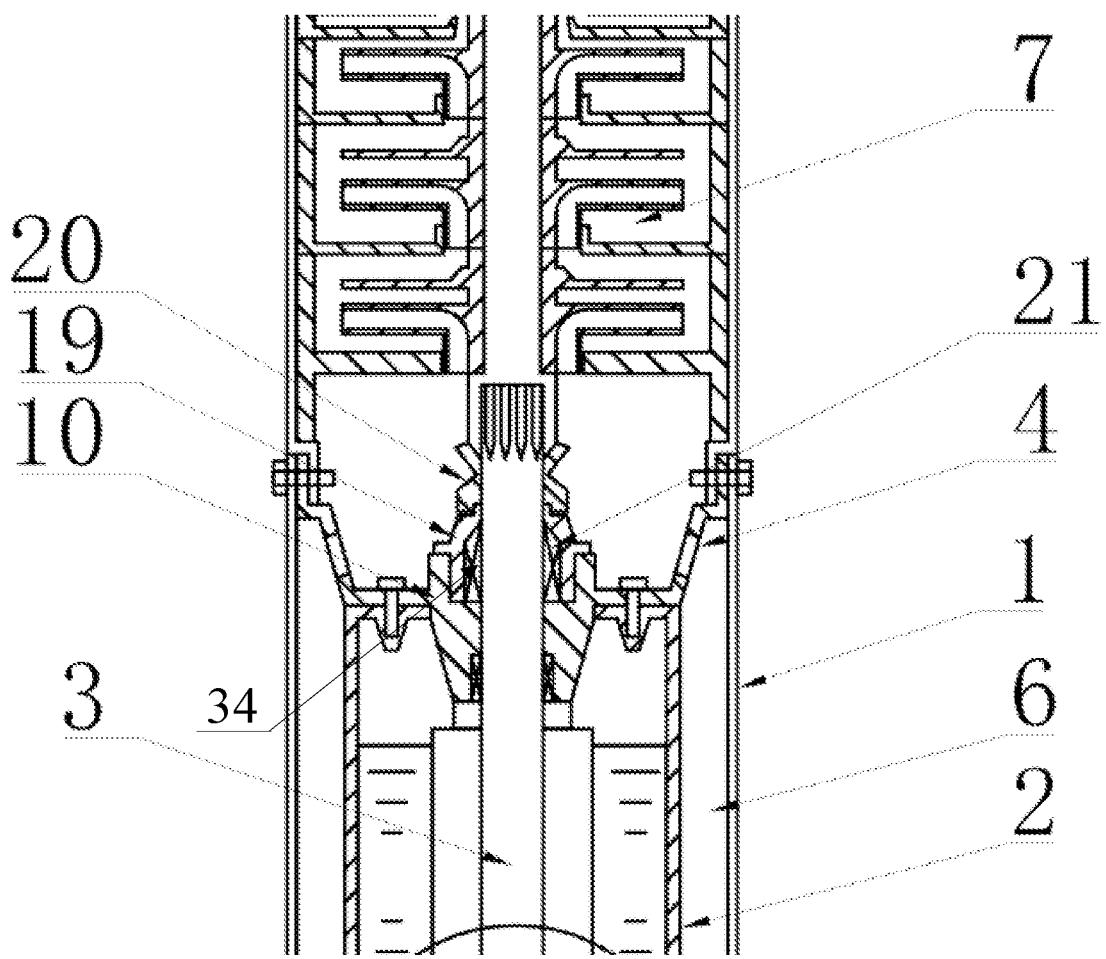
FIG. 5 is an enlarged schematic structural view of a part of FIG. 1 of the present invention.

The upper connection base 4 includes an upper end cover 10. The lower connection base 5 includes a lower end cover 11. The upper end cover 10 includes an upper axle hole 34 (shown in FIG. 5), and the lower end cover 11 includes a lower axle hole 35. The rotor shaft 3 passes through the upper axle hole 34 and the lower axle hole 35. A graphite sleeve 12 is provided in each of the axle holes 34 and 35, and a ceramic coating matching the graphite sleeve 12 is provided on the rotor shaft 3.

Both the graphite sleeve 12 and the ceramic coating can play a role of wear resistance, which are used to reduce the wear when the axle 9 rotates relative to each of the axle holes 34 and 35.

The rotor shaft 3 is also sleeved with a thrust structure provided between the lower end cover 11 and the rotor 33. The thrust structure includes an upper friction plate 13, a lower friction plate 14 and a thrust base 15 arranged successively from top to bottom. A spherical groove 36 is provided on an upper surface of the lower axle hole 35 of the lower end cover 11, and a spherical bump 16 adapted to the spherical groove 36 is provided at a bottom of the thrust base 15.

A first limiting groove 37 is provided on a top surface of the thrust base 15, a first limiting bump, or stop, 17 adapted to the first limiting groove 37 is provided on a bottom surface of the lower friction plate 14, a second limiting groove 38 is provided in the spherical groove 36. A second limiting bump, or stop, 18 adapted to the second limiting groove 38 is provided on an outer wall of the spherical bump 16.

The thrust structure is used to withstand the axial load of the motor assembly, and when the rotor 33 rotates, the upper friction plate 13 realizes a smooth rotation relative to the lower friction plate 14. Between the lower friction plate 14 and the thrust base 15, a circumferential limiting structure is realized by the adapted first limiting groove 37 and first limiting bump 17. Between the thrust base 15 and the lower connection base 5, a circumferential limiting structure is realized by the adapted second limiting groove 38 and second limiting bump 18. Wherein both the first limiting groove 37 and the second limiting groove 38 can be a strip-shaped groove structure. The thrust base 15 and the lower end cover 11 are fitted by a spherical surface so that the self-centering function can be achieved therebetween and the stability is better.

The rotor shaft is also sleeved with a sand throwing mechanism provided between the lower end cover 11 and the rotor 33. The sand throwing mechanism includes a sand throwing base 19 and a sand throwing ring 20 adapted thereof. A skeleton oil seal 21 is provided both between the sand throwing base 19 and the lower end cover 11 and between the sand throwing base 19 and the upper end cover 10.

The sand throwing base 19 is statically mounted on the lower end cover 11 and a surface groove hole of the lower end cover 11. The skeleton oil seal 21 is located in the sand throwing base 19, and used to increase sealing properties between rotation shafts of the upper end cover 10 and between the lower end cover 11 and the rotor shaft 3. Between the sand throwing ring 20 and the rotor shaft 3, there may be a key connection or a spline connection, so that the sand throwing ring 20 can rotate with the rotor shaft 3 to prevent impurities from entering the upper axle hole 34.

A waterway opening 39 penetrating the motor barrel 2 is provided on each of the upper connection base 4 and the lower connection base 5. A filter screen 40 is provided on the waterway opening 39, and the motor assembly adopts a shielded permanent magnet motor.

The motor coil of the shielded permanent magnet motor is fully covered and sealed by epoxy resin. The water flow can pass through the motor shell or a through hole on the rotor 33. The motor assembly can play a role of sufficient heat dissipation and explosion protection, which improves efficiency and saves energy and power. The waterway opening 39 allows part of the water flow to directly enter the motor. Since the motor uses a shielded structure, it will not be affected. The heat dissipation is performed inside the motor. The filter screen 40 prevents sediment from entering the motor barrel 2.

The bottom of the motor barrel 2 is a water inlet end 41. The top of the motor barrel 2 is a water outlet end 42, a bottom connection base 22 is provided on the water inlet end 41, and a lower axle sleeve 23, through which the axle 9 passes, is provided on the bottom connection base 22. A threaded connection port 24 is provided on the bottom connection base 22, wherein a bottom cover for fixing the bottom connection base 22 is provided at the bottom of the pump shell 1. The bottom surface of the bottom cover plays a role of axially fixing the bottom connection base 22. The outer peripheral wall of the bottom cover is connected to the pump shell 1 by pins and a set screw that axially abuts against the connection base is provided on the bottom cover of the pump shell 1. With the above structure, when the set screw is engaged, the set screw generates a tightening force with an upward pressure on the connection base, and then generates an axially abutting function against a volute through the connection base to ensure its stability.

A threaded connection port 24 is provided for connecting different components according to the use requirements. For example, when a filter shell is mounted on the threaded connection port 24, the multistage pump can be used as a submersible pump underwater. When the flange plate is mounted on the threaded connection port 24, it can be used to mount on the pipeline, and acts as a pipeline booster pump. When a one-way valve and a water pipe are connected to the threaded connection port 24, it can be used on land and acts as a self-priming pump.

In addition, when connected to the pipeline, a pressure sensor can be disposed on the water outlet end of the multistage pump to detect the water outlet pressure. The pressure sensor feeds the detection signal back to a drive control system of the permanent magnet motor. The drive control system adjusts the speed of the permanent magnet motor according to the change of pressure to achieve constant pressure water supply.

A pressing chamber 25 is provided at a top of the pump shell 1, an upper axle sleeve 26 through which the axle 9 passes is provided in the pressing chamber 25, the axle 9 is also sleeved with an upper friction ring 27 placed between the upper axle sleeve 26 and the upper impeller 31 and a lower friction ring 28 provided between the lower axle sleeve 23 and the lower impeller 30. The thickness of the upper friction ring 27 and the lower friction ring 28 can be adjusted according to the axial gap therebetween. The mounting of the upper friction ring 27 and the lower friction ring 28 can achieve the axial stability between them and ensure the stability during rotation. The lowermost end of the upper impeller 31 and the uppermost end of the lower impeller 30 can also be provided with an axial friction ring 29 that axially abuts against the axle 9, so as to further improve stability.

A cable cavity for guiding a cable is provided on the upper end cover 10. The cable cavity communicates with an outside of the pump shell 1. One end of the cable cavity communicates with the motor barrel 2, and a sealing sleeve through which the cable passes, is provided on a connecting end. The other end of the cable cavity can be led out by the pump shell 1. That is, the cable cavity can be an independent tube structure.

Embodiment 2

On the basis of the first embodiment, when the filter shell is mounted on the threaded connection port 24 and the multistage pump is used as a submersible pump underwater, the multistage pump is further controlled by a new control method.

A control method of a high-lift shielded permanent magnet multistage pump further includes a PLC control unit for controlling an operation state of the multistage pump, a current sensor for detecting a current change during operation of the multistage pump and an alarm module connected to the PLC control unit. The PLC control unit presets a two-level overcurrent protection current value. The two-level overcurrent protection current value includes a low-level overcurrent protection $I_1$ and a high-level overcurrent protection $I_2$, $I_1 < I_2$. The PLC control unit also includes a counting module and a speed regulation module. The counting module includes a low-level overcurrent protection counter, a high-level overcurrent protection counter and a current normal counter.

A rotation speed sensor for detecting a rotation speed change during operation of the multistage pump and a Hall sensor for detecting each phase current of the motor are also included. The counting module includes a restart number counter.

The control method includes the following steps:

an activation phase: the PLC control unit controls the motor to activate slowly by the speed regulation module;

in which the activation phase includes the following steps:

Q1. when the motor is powered on, the PLC control unit controls the motor to activate slowly through the speed regulation module;

Q2. the rotation speed sensor collects a rotation speed signal of the motor, judges a rotation speed state of the motor, and judges whether the restart number of the motor reaches E times;

Q3. if the restart number of the motor is less than E times in step Q2, and the rotation speed of the motor is lower than a normal rotation speed or the motor fails to rotate, the PLC control unit collects a current signal by the Hall sensor, judges whether a phase current difference is greater than 10%, and detects whether the motor current I is greater than the high-level overcurrent protection $I_2$;

Q4. if the phase current difference is less than 10% and $I < I_2$ in step Q3, the PLC control unit increases a torque signal and returns to step Q2;

Q5. if the phase current difference is greater than 10% and $I < I_2$ in step Q3, it is judged whether duration time is greater than a set time;

Q6. if YES in step Q5, go to step Q7;

Q7. the motor stops operation, after a delay of a first preset time, the motor reverses, and the restart number counter is increased by 1; after a delay of a second preset time, the motor stops reversing; after a delay of a third preset time, return to step Q1;

Q8. if NO in step Q5, return to step Q2;

Q9. if $I \geq I_2$ in step Q3, return to step Q7;

Q10. if the restart number of the motor reaches E times in step Q2, the motor is powered off and an alarm is given by the alarm module;

Q11. if the rotation speed is normal in step Q2, the motor activates normally and the restart number counter is cleared.

The above method solves the detection and control of the activation process of the multistage pump motor. When a stall occurs, the corresponding control is performed to prevent overcurrent and burnout of the motor. In order to detect the motor of the submersible pump, it is necessary to detect the current of each phase of the motor. The Hall sensor is used to measure the current of each phase. If the motor stalls after the motor is energized, the three-phase current will be imbalanced. Generally, if the difference between each two-phase current exceeds 10%, it can be considered as a three-phase imbalance. If the difference between the two phases exceeds 10%, the motor can be considered to be stalled, and then the corresponding control is performed. If the stall is detected, the PLC controller unit controls the reverse and forward of the motor orderly to remove the stall. When the fault cannot be removed, the control is repeated multiple times. If the fault cannot be removed after multiple forward and reverse, the power is turned off and an alarm is given. The setting time of duration time can be 1 second, which can avoid misjudgment due to instantaneous abnormal fluctuations of current. A delay first preset time can be 2 seconds, a delay second preset time can be 3 seconds, a delay third preset time can be 2 seconds, and a motor restart number E can be 3 times.

The Hall sensor is used to collect each current of the motor in real time, and is connected to each phase of the motor, respectively, and transmits the collected current data to the PLC control unit. According to the value of three-phase current, the PLC control unit determines whether a difference between each phase current is greater than 10% and whether it is greater than the high-level overcurrent protection current value. The rotation speed sensor is used to detect the rotation speed of the motor. After the power is turned on, if the motor operates normally, the rotation speed sensor can transmit the normal rotation speed signal to the PLC control unit. The motor activates normally, and the reverse or power-off protection is unnecessary.

The method can perform a stall self-check on the multistage pump motor during activation. The process is fast and efficient, and can be effectively managed, which avoids the damage of the multistage pump motor caused by the seize-up during activation.

The normal operation phase further includes:

providing a PLC control unit for controlling an operation state of the multistage pump, a current sensor for detecting a current change during operation of the multistage pump, and an alarm module connected to the PLC control unit, wherein the PLC control unit presets a two-level overcurrent protection current value, the two-level overcurrent protection current value includes a low-level overcurrent protection $I_1$ and a high-level overcurrent protection $I_2$, and $I_1 < I_2$, the PLC control unit also includes a counting module and a speed regulation module, the counting module includes a low-level overcurrent protection counter, a high-level overcurrent protection counter, a current normal counter, a half-speed forward counter and a half-speed reverse counter;

the control method includes the following steps:

an activation phase: the PLC control unit controls the motor to activate slowly by the speed regulation module;

the normal operation phase:

L1. the motor operates, the PLC control unit collects a motor current I in real-time every P seconds by the current sensor;

L2. the PLC control unit compares the collected motor current I with the low-level overcurrent protection $I_1$ and the high-level overcurrent protection $I_2$ respectively, if $I > I_2$, each of the low-level overcurrent protection counter and the high-level overcurrent protection counter is increased by 1, and the motor normal counter is cleared; if $I_1 < I < I_2$, the low-level overcurrent protection counter is increased by 1, and the motor normal counter is cleared; if $I < I_1$, the motor operates normally at full speed, and the motor normal counter is increased by 1, and if the motor normal counter reaches M times, the low-level overcurrent protection counter, the high-level overcurrent protection counter and the half-speed reverse counter are all cleared;

L3. if the motor current exceeds any one overcurrent protection in step L2, it is judged whether the low-level overcurrent protection is exceeded for X times or whether the high-level overcurrent protection is exceeded for Y times;

L4. if it is judged in step L3 that the low-level overcurrent protection reaches X times but the high-level overcurrent protection does not reach Y times, the motor is decelerated to half-speed and forwards for A seconds, the half-speed forward counter is increased by 1, and then it is judged whether the half-speed forward counter reaches F times;

L5. if it is judged in step L3 that the high-level overcurrent protection reaches Y times, go to step L9;

L6. if NO in step L3, return to step L1;

L7. if YES in step L4, go to step L9;

L8. if NO in step L4, the motor resumes forward at full speed and returns to step 1;

L9. the motor pauses for B seconds, and then the motor reverses at half speed for C seconds, the half-speed reverse counter is increased by 1, and it is judged whether the number of half-speed reverses reaches N times;

L10. if YES in step L9, the motor is powered off and an alarm is issued by the alarm module; L11. if NO in step L9, the motor rotates forward at full speed and returns to step L1.

The main reason for the pump clogging is usually that the impeller is jammed due to the sediment, or the water inlet end of the pump body is clogged. By adopting the above control method, the multistage pump is effectively prevented from being clogged. When the sediment impurities in the water affect the multistage pump, the load current $I_1$ of the motor will increase. When the load current $I_1$ reaches a certain limit, the PLC control unit controls the rotation speed of the motor to drop, so that the sediment can be discharged slowly to avoid further accumulation. When the speed reduction method cannot solve the clogging problem, the PLC control unit controls the motor to reverse, so that the sediment impurities can be washed out in the reverse direction, and the operation of the multistage pump returns to normal. When neither speed reduction nor reverse rotation can solve the clogging problem, the PLC control unit controls the motor to stop and issues an alarm signal by the alarm module to protect the motor.

This method sets two levels of protection points, so that the control and judgment are more reliable, and the motor has one more layer of safety protection. Moreover, during the control process, the deceleration or reverse step will be activated only when the motor current parameter is detected to be different from the preset parameter for multiple consecutive times, which can prevent the accidental fluctuation of the motor current from causing the control circuit to mistakenly judge that the multistage pump is clogged to cause unnecessary reverse and affect the normal operation of the water pump. Therefore, the accuracy and reliability during the control process are improved. Wherein the values represented by the above letters can be as follows: P is 1, N is 3, M is 5, X is 3, Y is 1, A is 5, B is 2, C is 5, and F is 2, and the values can be modified according to the actual control requirements.

The activation phase and the normal operation phase are independent judgment controls, and the detection control in the activation phase is only for the first-time activation detection after the multistage pump is powered off; in the normal operation phase, if the motor is suspended and restarted, the detection control in the activation phase will not be performed.

For the purposes of promoting an understanding of the principles of the invention, specific embodiments have been described. It should nevertheless be understood that the description is intended to be illustrative and not restrictive in character, and that no limitation of the scope of the invention is intended. Any alterations and further modifications in he described components, elements, processes or devices, and any further applications of the principles of the invention as described herein, are contemplated as would normally occur to one skilled in the art to which the invention pertains.

What is claimed is:

1. A high-lift shielded permanent magnet multistage pump, comprising: a pump shell, a motor assembly, a lower impeller, and an upper impeller, wherein,
the motor assembly comprises a motor barrel, a stator, a rotor, and a rotor shaft, wherein the pump shell is sleeved on an outside of the motor barrel, an upper connection base and a lower connection base are provided in the pump shell, and the upper connection base and the lower connection base are configured to fix the motor barrel;
a waterway cavity is formed between the pump shell and the motor barrel, an upper impeller cavity is formed at an upper end of the pump shell, a lower impeller cavity is formed at a lower end of the pump shell, the lower impeller cavity, the waterway cavity, and the upper impeller cavity are in sequential fluid communication;
an upper end of the rotor shaft passes through the upper connection base and a lower end of the rotor shaft passes through the lower connection base,
an axle is provided on each of the upper end and the lower end of the rotor shaft, and
the lower impeller and the upper impeller are multistage structures, the lower impeller mounts on the axle at the lower end of the rotor shaft, and the upper impeller mounts on the axle at the upper end of the rotor shaft, and
wherein a bottom of the motor barrel is a water inlet end, a top of the motor barrel is a water outlet end, a bottom connection base is provided on the water inlet end, and a lower axle sleeve through which the axle passes is provided on the bottom connection base, and a threaded connection port is provided on the bottom connection base.

2. The high-lift shielded permanent magnet multistage pump according to claim 1, wherein,
the upper connection base comprises an upper end cover, the lower connection base comprises a lower end cover, the upper end cover comprises an upper axle hole and the lower end cover comprises a lower axle hole, wherein the rotor shaft passes through the upper axle hole and the lower axle hole, a graphite sleeve is provided in the lower axle hole, and the rotor shaft is ceramic coated.

3. The high-lift shielded permanent magnet multistage pump according to claim 2, wherein,
the rotor shaft is sleeved with a thrust structure provided between the lower end cover and the rotor, the thrust structure comprises an upper friction plate, a lower friction plate, and a thrust base, wherein the upper friction plate, the lower friction plate, and the thrust base are arranged successively from top to bottom, a spherical groove is provided on an upper surface of the lower axle hole of the lower end cover, and a spherical bump adapted to the spherical groove is provided at a bottom of the thrust base.

4. The high-lift shielded permanent magnet multistage pump according to claim 3, wherein,
a first limiting groove is provided on a top surface of the thrust base, a first limiting bump adapted to the first limiting groove is provided on a bottom surface of the lower friction plate, a second limiting groove is provided in the spherical groove, and a second limiting bump adapted to the second limiting groove is provided on an outer wall of the spherical bump.

5. The high-lift shielded permanent magnet multistage pump according to claim 2, wherein, the rotor shaft is sleeved with a sand throwing mechanism provided above the upper connection base, the sand throwing mechanism comprises a sand throwing base and a sand throwing ring, wherein the sand throwing ring is correspondingly adapted to the sand throwing base, and a skeleton oil seal is provided between the sand throwing base and the upper end cover.

6. The high-lift shielded permanent magnet multistage pump according to claim 1, wherein,
a waterway opening penetrating the motor barrel is provided on both the upper connection base and the lower connection base, a filter screen is provided on the waterway opening, and the motor assembly adopts a shielded permanent magnet motor.

7. The high-lift shielded permanent magnet multistage pump according to claim 1, wherein,
a pressing chamber is provided at a top of the pump shell, an upper axle sleeve is provided in the pressing chamber, the axle passes through the upper axle sleeve, the axle is sleeved with an upper friction ring and a lower friction ring, the upper friction ring is provided between the upper axle sleeve and the upper impeller, and the lower friction ring is provided between the lower axle sleeve and the lower impeller.

8. A control method suitable for the high-lift shielded permanent magnet multistage pump comprising a pump shell, a motor assembly, a lower impeller, and an upper impeller, wherein,
the motor assembly comprises a motor barrel, a stator, a rotor, and a rotor shaft, wherein the pump shell is sleeved on an outside of the motor barrel, an upper connection base and a lower connection base are provided in the pump shell, and the upper connection base and the lower connection base are configured to fix the motor barrel;
a waterway cavity is formed between the pump shell and the motor barrel, an upper impeller cavity is formed at an upper end of the pump shell, a lower impeller cavity is formed at a lower end of the pump shell, the lower impeller cavity, the waterway cavity, and the upper impeller cavity are in sequential fluid communication;

an upper end of the rotor shaft passes through the upper connection base and a lower end of the rotor shaft passes through the lower connection base;

an axle is provided on each of the upper end and the lower end of the rotor shaft; and the lower impeller and the upper impeller are multistage structures, the lower impeller mounts on the axle at the lower end of the rotor shaft, and the upper impeller mounts on the axle at the upper end of the rotor shaft;

the control method comprising:

controlling an operation state of the high-lift shielded permanent magnet multistage pump, detecting a current change during an operation of the high-lift shielded permanent magnet multistage pump, and presetting a low-level overcurrent protection $I_1$ and a high-level overcurrent protection $I_2$, and $I_1<I_2$, the control method further comprising the following steps:

in an activation phase:
   activating the motor;

in a normal operation phase:
   L1: operating the motor, and collecting a motor current I in real-time every P seconds;
   L2: comparing the motor current I with the low-level overcurrent protection $I_1$ and the high-level overcurrent protection $I_2$, respectively, wherein,
      if $I>I_2$, increasing each of a low-level overcurrent protection counter and a high-level overcurrent protection counter by 1, and clearing a current normal counter;
      if $I_1<I<I_2$, increasing the low-level overcurrent protection counter by 1, and clearing a motor normal counter;
      if $I<I_1$, operating the motor at a full speed, and increasing the motor normal counter by 1, and
      if the motor normal counter reaches M times, clearing the low-level overcurrent protection counter, the high-level overcurrent protection counter, and a half-speed reverse counter;
   L3: if the motor current I exceeds the low-level overcurrent protection $I_1$ or the high-level overcurrent protection $I_2$ in step L2, judging whether the low-level overcurrent protection counter reaches X times or whether the high-level overcurrent protection counter reaches Y times;
   L4: if, in step L3, it is judged that the low-level overcurrent protection counter reaches the X times but the high-level overcurrent protection counter does not reach the Y times, decelerating the motor to a half speed and forwarding for A seconds, increasing a half-speed forward counter by 1, and then judging whether the half-speed forward counter reaches F times;
   L5: if, in step L3, it is judged that the high-level overcurrent protection counter reaches the Y times, going to step L9;
   L6: if the low-level overcurrent protection counter does not exceed the X times and the high-level overcurrent protection counter does not exceed for the Y times in step L3, returning to step L1;
   L7: if the half-speed forward counter reaches the F times in step L4, going to step L9;
   L8: if the half-speed forward counter does not reach the F times in step L4, forwarding the motor at the full speed and returns to step 1;
   L9: pausing the motor for B seconds, reversing the motor at the half speed for C seconds, increasing the half-speed reverse counter by 1, and judging whether a number of the half-speed reverse counter reaches N times;
   L10: if the number of the half-speed reverse counter reaches the N times in step L9, powering off the motor and issuing an alarm; and
   L11: if the number of the half-speed reverse counter does not reach the N times in step L9, forwarding the motor at the full speed and returning to step L1.

9. The control method of the high-lift shielded permanent magnet multistage pump according to claim 8, wherein,
the control method further comprising the following steps:
in the normal operation phase,
   Q1: when the motor is powered on, activating the motor;
   Q2: collecting a rotation speed signal of the motor, judging a rotation speed of the motor, and judging whether a restart number of the motor reaches E times;
   Q3: if the restart number of the motor is less than the E times in step Q2, and the rotation speed of the motor is lower than a normal rotation speed or the motor fails to rotate, collecting a current signal, and judging whether a phase current difference is greater than 10%, and detecting whether the motor current I is greater than the high-level overcurrent protection $I_2$;
   Q4: if the phase current difference is less than 10% and $I<I_2$ in step Q3, increasing a torque signal and returning to step Q2;
   Q5: if the phase current difference is greater than 10% and $I<I_2$ in step Q3, judging whether a duration time is greater than a set time;
   Q6: if the duration time is greater than the set time in step Q5, going to step Q7;
   Q7: ceasing to operate the motor; after delaying a first preset time, reversing the motor, and a restart number counter is increased by 1; after delaying a second preset time, ceasing to reverse the motor; after delaying a third preset time, returning to step Q1;
   Q8: if the duration time is not greater than the set time in step Q5, returning to step Q2;
   Q9: if $I \geq I_2$ in step Q3, returning to step Q7;
   Q10: if the restart number of the motor reaches the E times in step Q2, powering off the motor and giving an alarm; and
   Q11: if the rotation speed is normal in step Q2, activating the motor and clearing the restart number counter.

10. The control method according to claim 8, wherein,
the upper connection base comprises an upper end cover, the lower connection base comprises a lower end cover, the upper end cover comprises an upper axle hole and the lower end cover comprises a lower axle hole, wherein the rotor shaft passes through the upper axle hole and the lower axle hole, a graphite sleeve is provided in the lower axle hole, and the rotor shaft is ceramic coated.

11. The control method according to claim 10, wherein,
the rotor shaft is sleeved with a thrust structure provided between the lower end cover and the rotor, the thrust structure comprises an upper friction plate, a lower friction plate, and a thrust base, wherein the upper friction plate, the lower friction plate, and the thrust base are arranged successively from top to bottom, a spherical groove is provided on an upper surface of the lower axle hole of the lower end cover, and a spherical bump adapted to the spherical groove is provided at a bottom of the thrust base.

12. The control method according to claim 11, wherein, a first limiting groove is provided on a top surface of the thrust base, a first limiting bump adapted to the first limiting groove is provided on a bottom surface of the lower friction plate, a second limiting groove is provided in the spherical groove, and a second limiting bump adapted to the second limiting groove is provided on an outer wall of the spherical bump.

13. The control method according to claim 10, wherein, the rotor shaft is sleeved with a sand throwing mechanism provided below the lower connection base, the sand throwing mechanism comprises a sand throwing base and a sand throwing ring, wherein the sand throwing ring is correspondingly adapted to the sand throwing base, and a skeleton oil seal is provided between the sand throwing base and the lower end cover.

14. The control method according to claim 8, wherein,
a waterway opening penetrating the motor barrel is provided on both the upper connection base and the lower connection base, a filter screen is provided on the waterway opening, and the motor assembly adopts a shielded permanent magnet motor.

15. The control method according to claim 8, wherein,
a pressing chamber is provided at a top of the pump shell, an upper axle sleeve is provided in the pressing chamber, the axle passes through the upper axle sleeve, the axle is sleeved with an upper friction ring and a lower friction ring, the upper friction ring is provided between the upper axle sleeve and the upper impeller, and the lower friction ring is provided between the lower axle sleeve and the lower impeller.

* * * * *